(12) United States Patent
Yen et al.

(10) Patent No.: US 10,263,093 B2
(45) Date of Patent: Apr. 16, 2019

(54) OPTOELECTRONIC SEMICONDUCTOR DEVICE AND FABRICATION METHOD THEREOF

(71) Applicant: HIGH POWER OPTO. INC., Taichung (TW)

(72) Inventors: Wei-Yu Yen, Taichung (TW); Li-Ping Chou, Taichung (TW); Wan-Jou Chen, Taichung (TW); Chih-Sung Chang, Taichung (TW)

(73) Assignee: HIGH POWER OPTO. INC., Taichung (TW)

( * ) Notice: Subject to any disclaimer, the term of this patent is extended or adjusted under 35 U.S.C. 154(b) by 0 days.

(21) Appl. No.: 15/926,798

(22) Filed: Mar. 20, 2018

(65) Prior Publication Data

US 2019/0019878 A1 Jan. 17, 2019

(30) Foreign Application Priority Data

Jul. 17, 2017 (TW) .............................. 106123872 A

(51) Int. Cl.
*H01L 33/38* (2010.01)
*H01L 29/66* (2006.01)
(Continued)

(52) U.S. Cl.
CPC .... *H01L 29/66106* (2013.01); *H01L 27/0255* (2013.01); *H01L 33/0079* (2013.01);
(Continued)

(58) Field of Classification Search
CPC ............................ H01L 33/382; H01L 27/153
(Continued)

(56) References Cited

U.S. PATENT DOCUMENTS 8,614,450 B2* 12/2013 Kim .................... H01L 33/0079
257/79
2003/0189201 A1* 10/2003 Chen .................... H01L 25/167
257/13
(Continued)

FOREIGN PATENT DOCUMENTS

CN 101315966 B 6/2010
CN 101108965 B 2/2011
(Continued)

*Primary Examiner* — George Fourson, III

(57) ABSTRACT

An optoelectronic semiconductor includes a carrier, a semiconductor main body having a first semiconductor layer, a second semiconductor layer, and a radiation emitting layer for generating electromagnetic radiation, the semiconductor main body having at least one recess extending through the radiation emitting layer; a first electrode and a second electrode; a first electrical connection layer electrically connected between the first semiconductor layer and the first electrode; a second electrical connection layer electrically connected between the second semiconductor layer and the second electrode and extending through the recess from the carrier to the second semiconductor layer; and a zener diode structure disposed between the first electrical connection layer and the second electrical connection layer so that the first electrical connection layer and the second electrical connection layer are electrically dependent, wherein at least a portion of the zener diode structure is located in a current path between the first electrode and the second electrode.

19 Claims, 16 Drawing Sheets

(51) Int. Cl.
   *H01L 27/02*   (2006.01)
   *H01L 33/00*   (2010.01)
   *H01L 33/48*   (2010.01)
   *H01L 33/36*   (2010.01)
   *H01L 27/15*   (2006.01)

(52) U.S. Cl.
   CPC .............. *H01L 33/36* (2013.01); *H01L 33/48* (2013.01); *H01L 27/153* (2013.01); *H01L 33/382* (2013.01)

(58) Field of Classification Search
   USPC ............................................. 257/99; 438/42
   See application file for complete search history.

(56) References Cited

U.S. PATENT DOCUMENTS

| | | | |
|---|---|---|---|
| 2005/0205887 A1* | 9/2005 | Shei | H01L 25/167 257/99 |
| 2009/0023015 A1* | 1/2009 | Hiramatsu | C09K 11/7734 428/690 |
| 2011/0095320 A1* | 4/2011 | Hwang | H01L 27/15 257/98 |
| 2011/0198621 A1* | 8/2011 | Choi | H01L 27/15 257/88 |
| 2014/0124825 A1 | 5/2014 | Choi et al. | |

FOREIGN PATENT DOCUMENTS

| | | |
|---|---|---|
| TW | 201145566 A | 12/2011 |
| TW | 201327918 A1 | 7/2013 |
| TW | 201605071 A | 2/2016 |

* cited by examiner

OPTOELECTRONIC SEMICONDUCTOR DEVICE AND FABRICATION METHOD THEREOF

FIELD OF THE INVENTION

The invention relates to an optoelectronic semiconductor chip, and more particularly to a semiconductor light-emitting device with circuit protection elements.

BACKGROUND OF THE INVENTION

In high power optoelectronic semiconductor devices, such as light emitting diode wafers, suitable electrostatic discharge (ESD) protection measures are often required to protect the light emitting diode wafers. The traditional approach is usually to provide an external protect components, such as a diode, parallel connected to the chip of the light emitting diode, but this approach will usually increase the cost and occupation of electronic products circuit layout space. Another approach is to integrate the protect diode into the process of the light emitting diodes, but the existing technology cannot be easily adjusted or changed for different needs, thus increasing the design and production costs, and decreasing the production flexibility under different applications.

SUMMARY OF THE INVENTION

One of the purposes of the invention is to provide an optoelectronic semiconductor device with functions of electrostatic discharge protection, and its manufacturing method.

The invention provides an optoelectronic semiconductor device, includes a conductive carrier; a semiconductor main body comprising a first semiconductor layer, a second semiconductor layer, and a radiation emitting layer for emitting electromagnetic radiation, wherein the radiation emitting layer is sandwiched between the first semiconductor layer and the second semiconductor layer, the second semiconductor layer is disposed on a side of the radiation emitting layer away from the conductive carrier, and the semiconductor main body comprising at least a concave part extending from a surface of the first semiconductor layer and penetrating through the radiation emitting layer; a first electrode and a second electrode; a first electrical connection layer, electrically connected between the first semiconductor layer and the first electrode; a second electrical connection layer, electrically connected between the second semiconductor layer and the second electrode, and the concave part being extruded from the conductive carrier toward the second semiconductor layer; and a zener diode structure disposed between the first electrical connection layer and the second electrical connection layer, so that the first electrical connection layer and the second electrical connection layer are electrically connected with each other, wherein at least a portion of the zener diode structure is disposed on a current path between the first electrode and the second electrode.

In one embodiment of the invention, the zener diode structure includes a first electrical conductive semiconductor layer disposed on a side of the zener diode structure facing the first electrical connection layer; and a second electrical conductive semiconductor layer disposed on a side of the zener diode structure facing the second electrical connection layer.

In another aspect of the invention, the optoelectronic semiconductor device includes a plurality of zener diode structures connected in series, and two adjacent ones of the zener diode structures are connected by a metal layer In one embodiment of the invention, the zener diode structure is disposed on the side of the second electrical connection layer away from the conductive carrier and extending toward the second semiconductor layer with the second electrical connection layer in the concave part.

The optoelectronic semiconductor device of the invention may further include an insulation layer disposed within the concave part, and insulating the semiconductor main body and the zener diode structure. The other way for insulating is to provide a passivated surface as a contact of the semiconductor main body adjacent to the zener diode structure.

In one embodiment of the invention, the first electrical connection layer is disposed on a side of the zener diode structure away from the conductive carrier, and is electrically connected with the first semiconductor layer on a side of the first electrical connection layer away from the conductive carrier.

The first electrical connection layer may be a mirror protective layer. The optoelectronic semiconductor device may further includes a mirror ohmic contact layer disposed between the mirror protective layer and the first semiconductor layer, and providing an ohmic contact between the mirror protective layer and the first semiconductor layer.

The invention also provides a manufacturing method of an optoelectronic semiconductor device, which includes forming a semiconductor main body, wherein the semiconductor main body comprises a first semiconductor layer, a second semiconductor layer, and a radiation emitting layer sandwiched between the first semiconductor layer and the second semiconductor layer; etching a concave part on the semiconductor main body, wherein the concave part penetrating through the radiation emitting layer and extending toward the first semiconductor layer; forming a first electrical connection layer on the semiconductor main body, wherein the first electrical connection layer is electrically connected with the first semiconductor layer; forming at least a zener diode structure on the first electrical connection layer; forming a second electrical connection layer on the zener diode structure, wherein through the zener diode structure, the first electrical connection layer is electrically dependent on the second electrical connection layer; and forming a first electrode and a second electrode, electrically connected to the first electrical connection layer and the second electrical connection layer, respectively, and having at least a partial structure of the zener diode structure disposed within the current path between the first electrode and the second electrode.

In one aspect of the invention, forming the zener diode structure may includes steps of forming a first electrical conductive semiconductor layer on the first electrical connection layer; forming a second electrical conductive semiconductor layer on the first electrical conductive semiconductor layer, so as to construct a zener diode structure with the first electrical conductive semiconductor layer; when more than one of the zener diode structure are to be formed, executing a series connecting process, the series connecting process comprises forming a metal layer on the second electrical conductive semiconductor layer of a last formed zener diode structure to be series connected, and forming a zener diode structure next to the last formed zener diode structure; and repeatedly executing the series connecting process until the number of the zener diode structures achieve a predetermined value.

In one aspect of the invention, forming the second electrical connection layer may includes steps of forming an upper half portion of the second electrical connection layer within the concave part, wherein the upper half portion is electrically connected with the second semiconductor layer on the bottom side of the concave part; and forming a lower half portion of the second electrical connection layer on the zener diode structure, and the lower half portion is electrically connected with the upper half portion.

In one embodiment, the manufacturing method of the optoelectronic semiconductor device may further include forming an insulation layer within the concave part for insulating the semiconductor main body and the zener diode structure. The semiconductor main body and the zener diode structure may also be insulated by forming a passivated surface on a contact surface of the semiconductor main body adjacent to the zener diode structure through a plasma surface treatment.

In one embodiment, the first electrical connection layer is a mirror protective layer. The manufacturing method of the optoelectronic semiconductor device may further include forming a mirror ohmic contact layer disposed between the mirror protective layer and the first semiconductor layer for providing an ohmic contact between the mirror protective layer and the first semiconductor layer.

The manufacturing method of the optoelectronic semiconductor device according to the invention may further include forming a conductive carrier on the second electrical connection layer after forming the second electrical connection layer.

In one embodiment, the semiconductor main body is formed on a growth substrate, and the manufacturing method further includes executing a flip operation after forming the conductive carrier, so that orientations of the conductive carrier and the growth substrate are exchanged; and removing the growth substrate. Before forming the semiconductor main body, a buffer layer may be formed on the growth substrate, and be removed after executing the flip operation.

The foregoing description is merely an overview of the technical solution of the invention. In order to enable a clearer understanding of the technical means of the invention, and thus it can be implemented in accordance with the teachings of the invention, and to enable the above features and advantages of the invention to be more clearly understood, the embodiments are described in detail with reference to the accompanying drawings.

DETAILED DESCRIPTION OF PREFERRED EMBODIMENTS

In order to further illustrate the technical means of the invention, the specific embodiments, structures, features and effects thereof according to the invention will be described in detail with reference to the accompanying drawings and examples.

Figure 1:
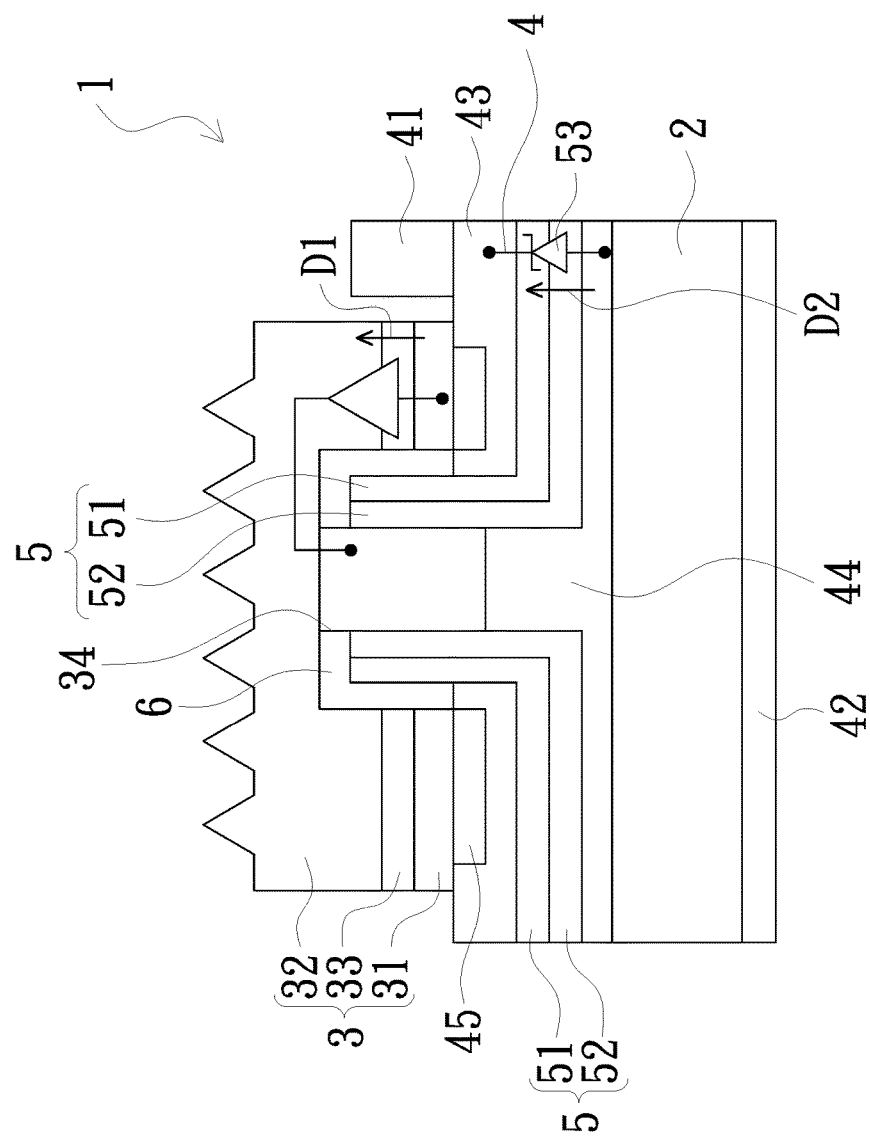
FIG. 1 is a cross-sectional view of a photovoltaic semiconductor structure according to an embodiment of the invention.

Referring to FIG. 1, the optoelectronic semiconductor device 1 may be but is not limited to a light emitting diode chip, which includes the conductive carrier 2 and the semiconductor main body 3 formed on the conductive carrier 2. The semiconductor main body 3 includes the first semiconductor layer 31, the second semiconductor layer 32, and the radiation emitting layer 33 for emitting electromagnetic radiation. The first semiconductor layer 31 and the second semiconductor layer 32 may different may have different electrical properties. The radiation emitting layer 33 is sandwiched between the first semiconductor layer 31 and the second semiconductor layer 32, and thus forms, for example, a light emitting diode structure. The second semiconductor layer 32 is located on the side of the radiation emitting layer 33 away from the conductive carrier 2. The semiconductor main body 3 has at least one concave part 34 extending from the first semiconductor layer 31 through the radiation emitting layer 33. The semiconductor main body 3 is connected to the first electrode 41 and the second electrode 42, where the first semiconductor layer 31 and the second semiconductor layer 32 are electrically connected to the first electrode 41 and the second electrode 42, respectively, by the first electrical connection layer 43 and the second electrical connection layer 44, respectively. The second electrical connection layer 44 extends through the concave part 34 from the conductive carrier 2 to the second semiconductor layer 32 and is in electrical contact with it. In one embodiment of the invention, the first electrode 41 is a positive electrode composed of metal such as Cr, Pt or Au, and is electrically connected to the first semiconductor layer 31 composed of P-type epitaxial semiconductor, through the first electrical connection layer 43 made of a metal such as Ti or Pt The second electrode 42 is a negative electrode composed of a metal such as Ti, Pt or Au, and is electrically connected to the second semiconductor layer 32 composed of an N-type epitaxial semiconductor through the conductive carrier 2 composed of Si, and the second electrical connection layer 44 made of metal such as Ti, Pt, Au or In, and the like, but the invention is not limited thereto.

The zener diode structure 5 is disposed between the first electrical connection layer 43 and the second electrical connection layer 44 so that the first electrical connection layer 43 is electrically dependent on the second electrical connection layer 44. In order to achieve the electrostatic discharge protection function, the partial structure 53 of the zener diode structure 5 is located in the current electrode 4 (only a portion is shown in the figure) between the first electrode 41 and the second electrode 42, and becomes a circuit protection element. The zener diode structure 5 includes the first electrical conductive semiconductor layer 51 and the second electrical conductive semiconductor layer 52. The first electrical conductive semiconductor layer 51 may be, but is not limited to, N-type semiconductors such as aluminum nitride doped silicon (AlN: Si), Silicon doped silicon (Si: P), germanium doped phosphorus (Ge: P), silicon carbide (SiC), or zinc oxide (ZnO), etc., on the side of the zener diode structure 5 facing the first electrical connection layer 43. The zener diode structure 5 is disposed on the side of the second electrical connection layer 44, which is connected to the second electrical connection layer 44 and extends along the second electrical connection layer 44 to the second semiconductor layer 32 in the concave part 34.

The optoelectronic semiconductor device 1 further includes an insulation layer 6, disposed within the concave part 34, and makes the semiconductor main body 3 electrically isolated from the zener diode structure 5. In addition, as shown in FIG. 4G, the surface of the main body 3 adjacent and contacted with the zener diode structure 5 may be made to be a non-conductive passivated surface 35, and also has the effect of electrically isolating the main body 3 from the zener diode structure 5. In one embodiment of the invention, the insulation layer 6 is made of $SiO_2$, but it is not to limit the invention.

The first electrical connection layer 43 is disposed on the side of the zener diode structure 5 away from the conductive carrier 2 and is in electrical contact with the first semiconductor layer 31 on the side of the first electrical connection layer 43 away from the conductive carrier 2. The first electrical connection layer 43 is a mirror protective layer. The optoelectronic semiconductor device 1 further includes a mirror ohmic contact layer 45 disposed between the mirror protective layer (the first electrical connection layer 43) and the first semiconductor layer 31 and providing an ohmic contact between the mirror protective layer and the first semiconductor layer 31. In the embodiment of the invention, mirror ohmic contact layer 45 may be made of metal such as Ag, TiW or Pt.

Figure 2:
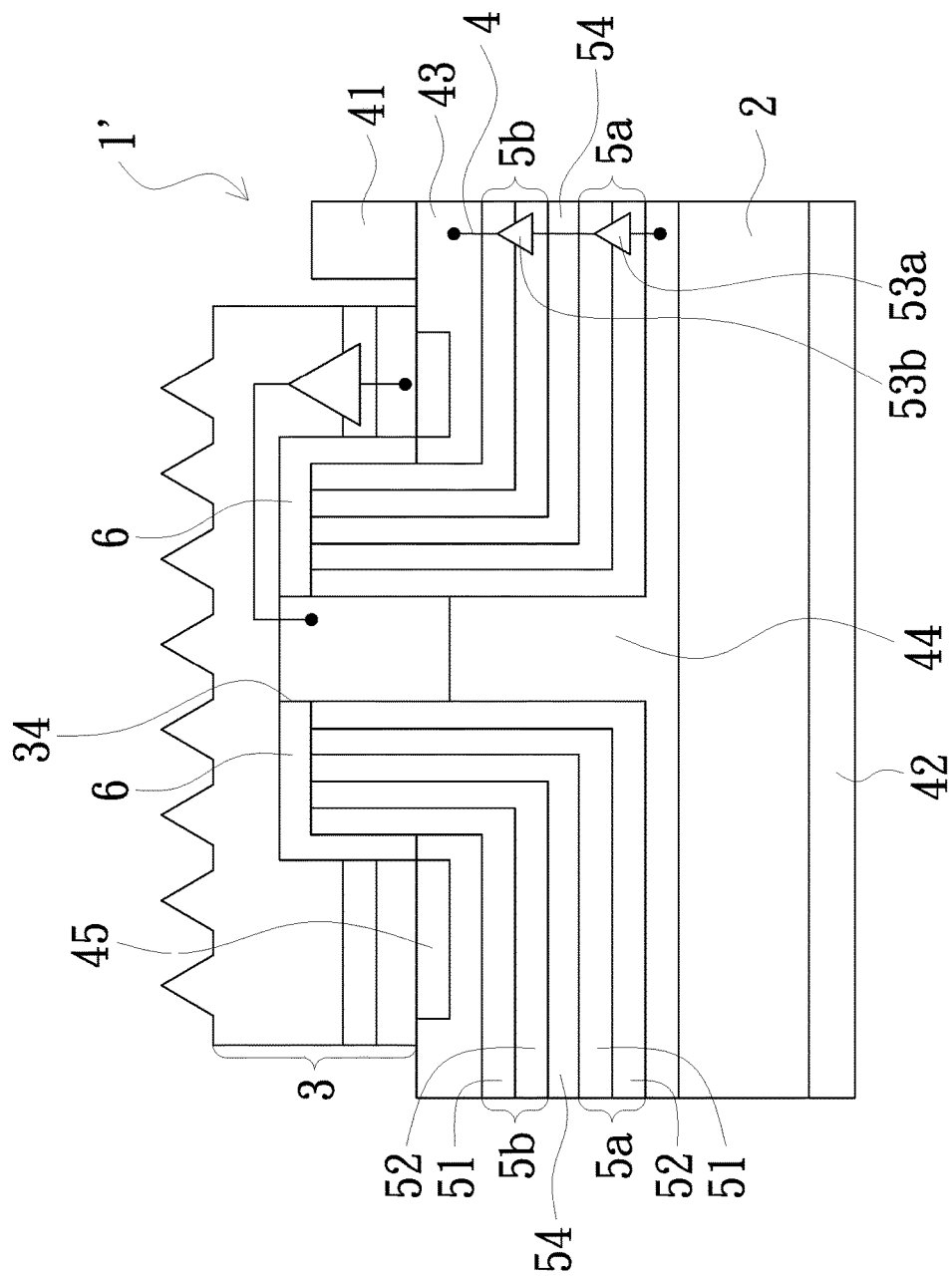
FIG. 2 is a cross-sectional view of a photovoltaic semiconductor structure according to another embodiment of the invention

When the optoelectronic semiconductor device 1 is operated, a forward bias may be applied to the first electrode 41 and the second electrode 42, causing the current to flow through the semiconductor main body 3 along the current direction D1 to emit light through the light emitting diode structure within it. In the case of reverse bias, since the zener diode structure 5 is disposed on the current path 4, the current will flow along the current direction D2 to the zener diode structure 5 because it has a characteristic that having a reverse breakdown voltage much larger than that of a general diode, and thus may provide circuit protection for the optoelectronic semiconductor device 1. In different applications, the protection of components may be required to withstand a wider voltage range, and thus may not be achieved by a single zener diode structure. Accordingly, multiple zener diode structure may be connected in series to achieve the aforementioned purpose. The way to produce the zener diode structures in series is to stack the zener diode structure described above in vertical direction, and every two adjacent zener diode structures are connected by a metal layer. FIG. 2 illustrates two zener diode structures 5a and 5b stacked within the optoelectronic semiconductor device 1', which are adjacent to each other in a stacking manner and are connected with the metal layer 54. The partial structure 53a/53b of the zener diode structure 5a/5b is disposed within the current path 4 between the first electrode 41 and the second electrode 42 as a circuit protection element connected in series. The number of zener diode structures shown in FIG. 2 is only an example, and the actual number of concatenations may be adjusted for various applications.

Figure 3A:
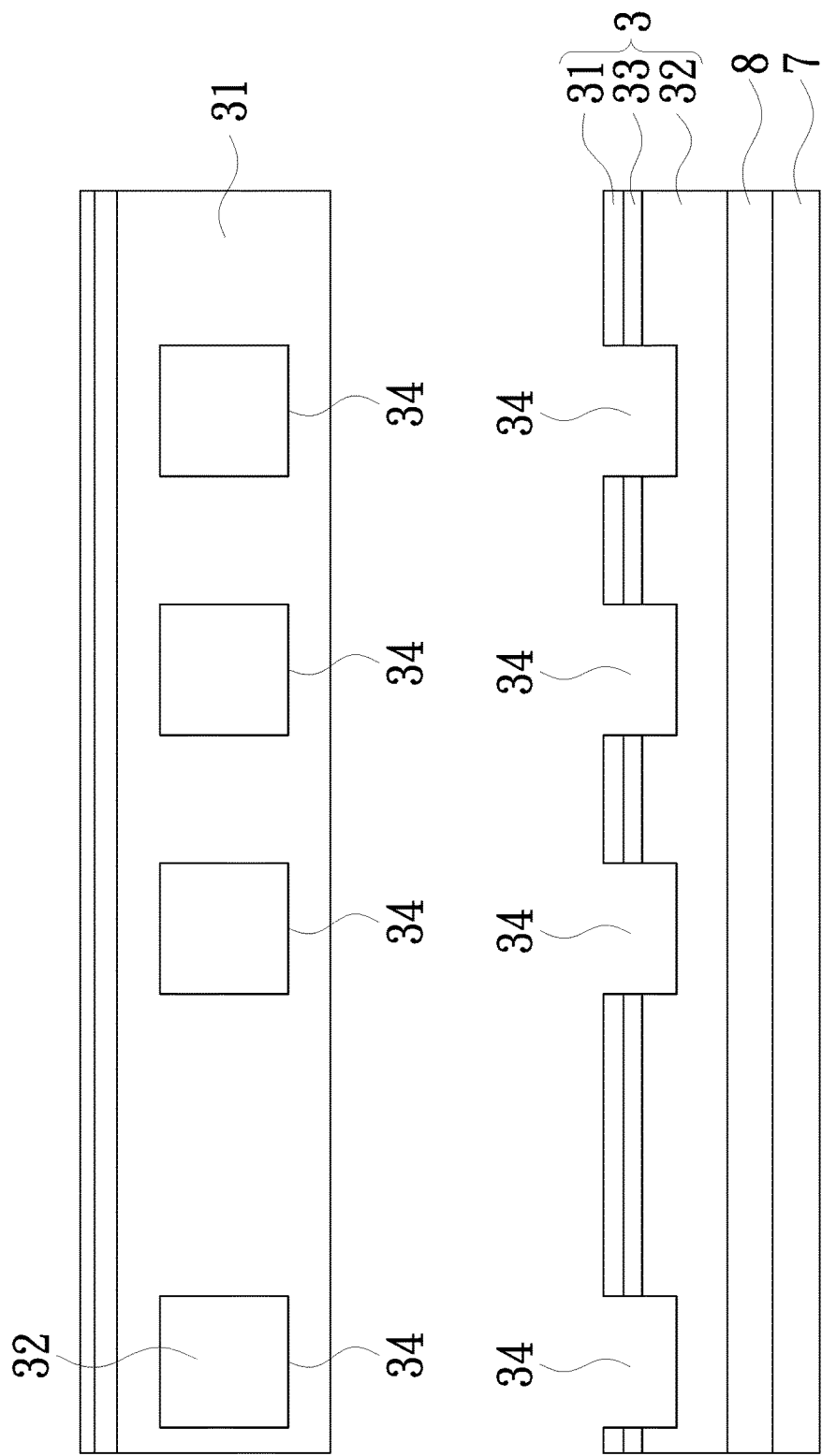
FIGS. 3A to 3G are schematic views showing a manufacturing process of a photovoltaic semiconductor according to an embodiment of the invention.

FIGS. 3A-3G illustrate a manufacturing process embodiment of the optoelectronic semiconductor device according to the invention. As shown in FIG. 3A, the buffer layer 8, the second semiconductor layer 32, the radiation emitting layer 33 and the first semiconductor layer 31 are grown on a growth substrate 7 made of sapphire or silicon carbide in order by, for example, but not limited to epitaxial, wherein the second semiconductor layer 32, the radiation emitting layer 33 and the first semiconductor layer 31 construct the semiconductor main body 3. The first semiconductor layer 31 and the second semiconductor layer 32 are implanted with different electrical doping, while the radiation emitting layer 33 is not doped. Next, the concave part 34 is etched on the semiconductor main body 3 by photolithography/etching process. Wherein, the concave part 34 extends from the first semiconductor layer 31 through the radiation emitting layer 33, so that a portion of the second semiconductor layer 32 exposes at the bottom of the concave part 34. In one embodiment of the invention, the material of the buffer layer 8, the second semiconductor layer 32, the radiation emitting layer 33 and the first semiconductor layer 31 may be u-GaN, n-GaN, undoped GaN and p-GaN, but is not to limit the invention.

Figure 3B:
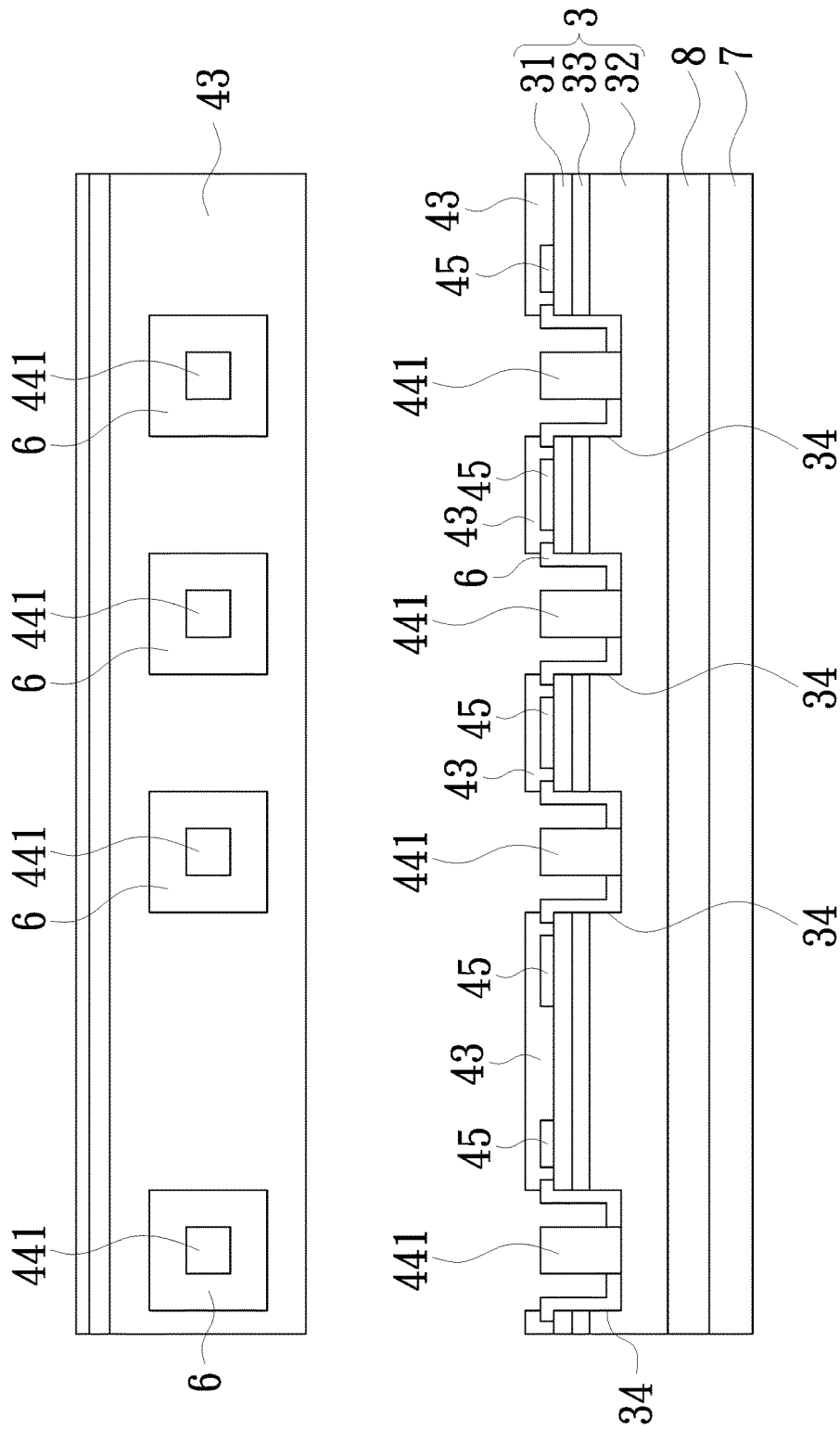

Next, as shown in FIG. 3B, an insulation layer 6 is formed within the concave part 34 so that the semiconductor main body 3 is electrically isolated from the subsequent formed zener diode structure. The formation steps of the insulation layer 6 include depositing an insulating material such as silicon dioxide on the semiconductor main body 3 and removing the excess insulating material by photolithography/etching process so that the surfaces of the first semiconductor layer 31 and second semiconductor layer 32 at the bottom of the concave part 34 are exposed. Thereafter, a layer of metal such as Ag, TiW or Pt is sputtered, and the metal layer is patterned to form a mirror ohmic contact layer 45 on the surface of the first semiconductor layer 31. Next, a metal such as Ti or Pt is deposited, followed by patterning the process to form a first electrical connection layer 43 covering the surface of the first semiconductor layer 31 and depositing a metal such as Au, Pt or Cr, and a related pattern, Is formed on the second semiconductor layer 32, which is not covered by the insulation layer 6, forming the upper half portion 441 of the second electrical connection layer 44, which is in electrical contact with the second semiconductor layer 32.

Figure 3C:
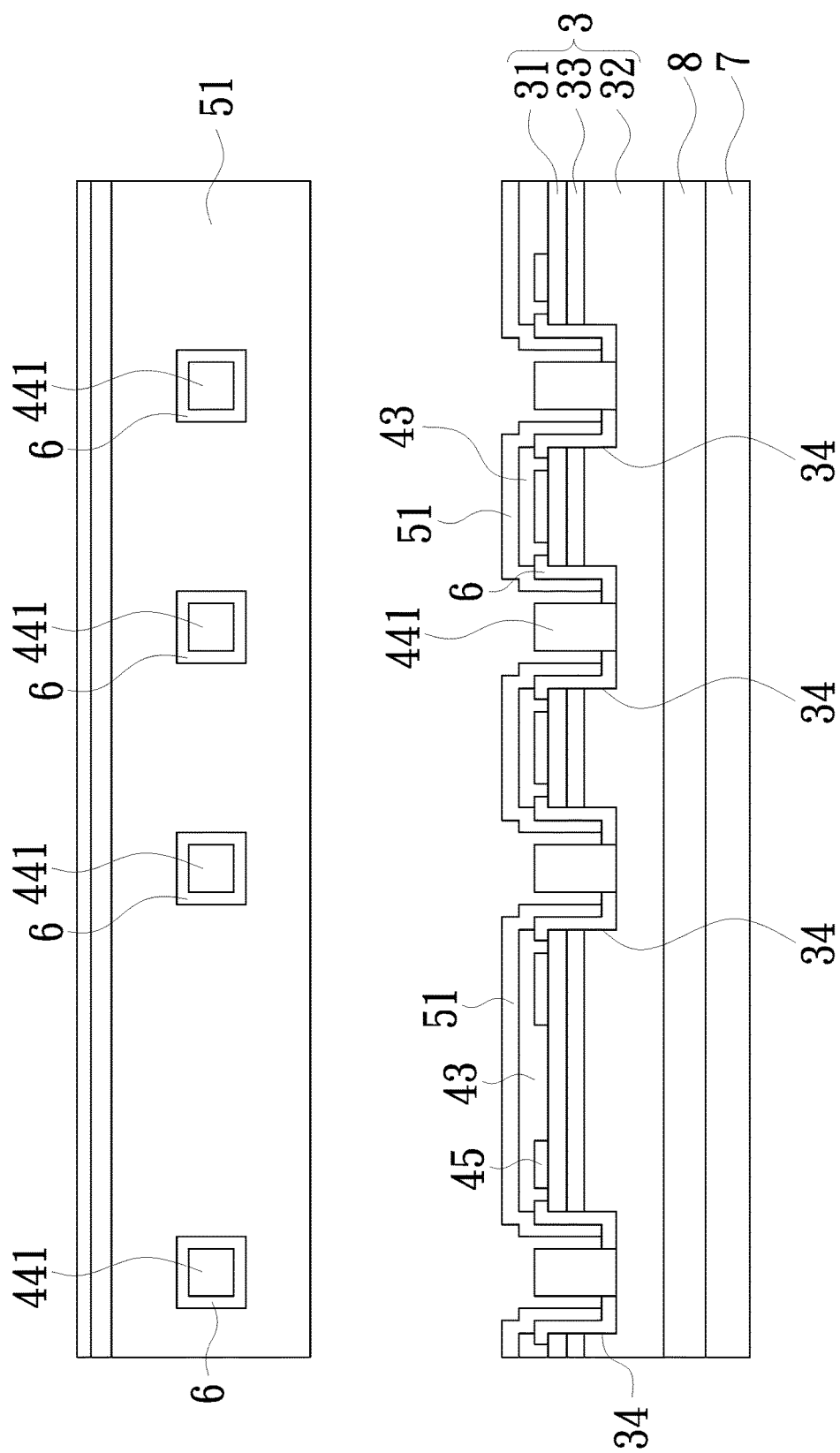
Figure 3D:
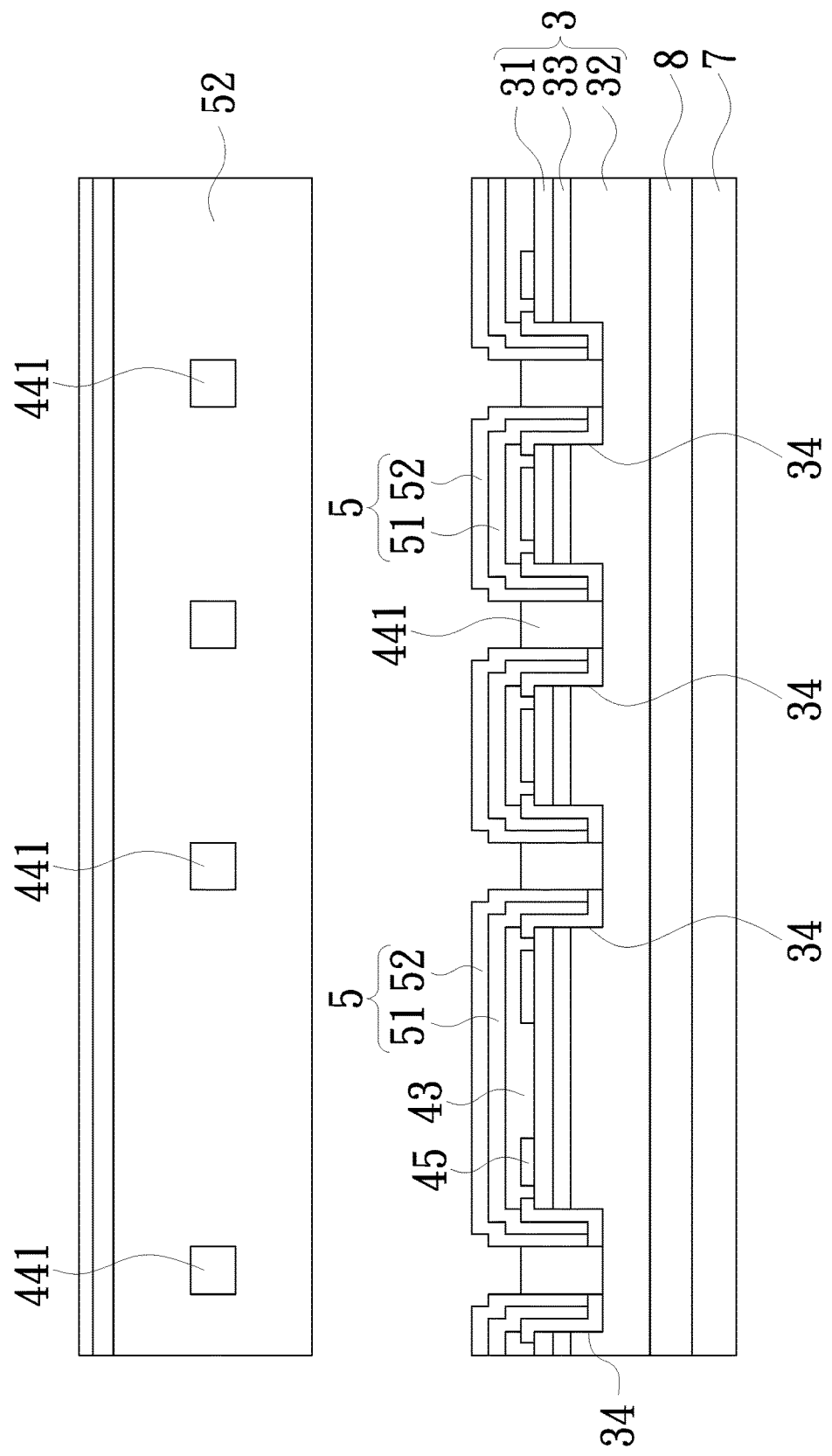
Figure 3E:
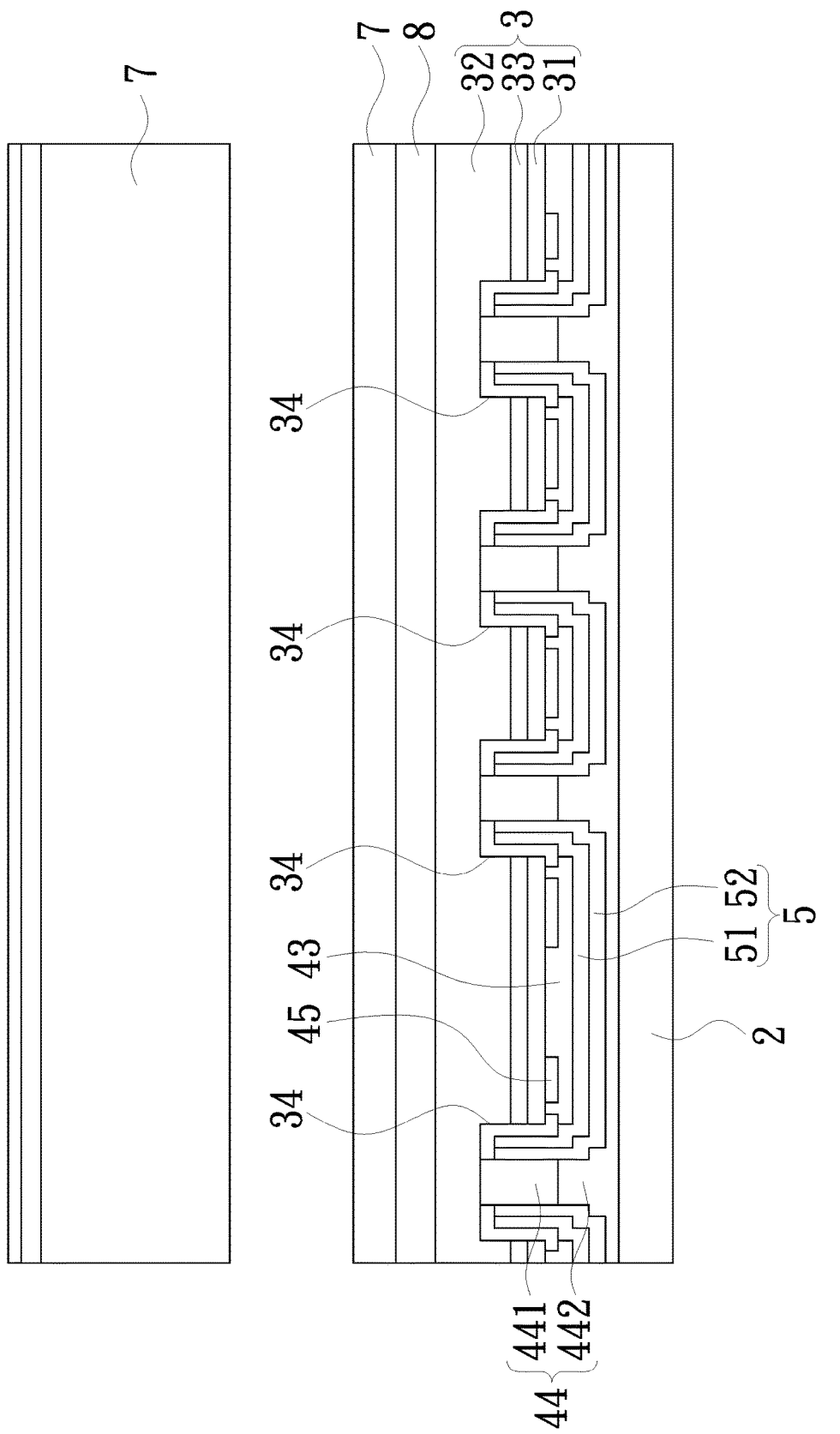

Then, as shown in FIG. 3C and FIG. 3D, the first electrical conductive semiconductor layer 51 is formed by the epitaxy and doping procedure on the first electrical connection layer 43 and the concave part 34, and the epitaxial and doping procedures are used in the first electrical conductive semiconductor layer 51 to form a second electrical conductive semiconductor layer 52, so as to construct the zener diode structure 5. Wherein, the first electrical conductive semiconductor layer 51 and the second electrical conductive semiconductor layer 52 are doped with different electrical dopants. For example, the first electrical conductive semiconductor layer is p-type and the second electrical conductive semiconductor layer 52 is N type. Then, as shown in FIG. 3E, metal such as Ti, Pt, Au, or In is sputtered above the zener diode structure 5 to fill the concave part 34 and cover the surface of the second electrical conductive semiconductor layer 52, to form the lower half portion 442 of the second electrical connection layer 44. The lower half portion 442 of the second electrical connection layer 44 is in electrical contact with the upper half portion 441 in the concave part 34, and construct a complete second electrical connection layer 44. In this way, the zener diode structure 5 with an antistatic function is disposed and connected between the first electrical connection layer 43 and the second electrical connection layer 44, and thus making both being electrically dependent. To form more than one zener diode structure (e.g., 5a, 5b) as shown in FIG. 2, a series of steps may be performed, including forming a metal layer 54 on the second electrical connection layer of the zener diode structure (e.g., 5b) to be concatenated, and forming the next zener diode structure (e.g., 5a) on the metal layer 54. This series of steps can be repeated until the number of the formed zener diode structures reaches a predetermined value.

The surface of the lower half portion 442 of the second electrical connection layer 44 is bonded to a material such as silicon to form a conductive carrier 2 such as a silicon wafer. Wherein the conductive carrier 2 may implant the same electrical properties as the second semiconductor layer 32 to facilitate electrical conduction between the second electrode 42 and the second semiconductor layer 32. Thereafter, a flip operation may be performed to invert the entire device wafer including the growth substrate 7 so that the orientation of the conductive carrier 2 and the growth substrate 7 is exchanged. That is, the growth substrate 7 becomes the uppermost and the conductive carrier 2 is below. In the embodiment of the invention, the growth substrate 7 and the buffer layer 8 above the inverted device wafer can be removed to expose the surface of the second semiconductor layer 32.

Figure 3F:
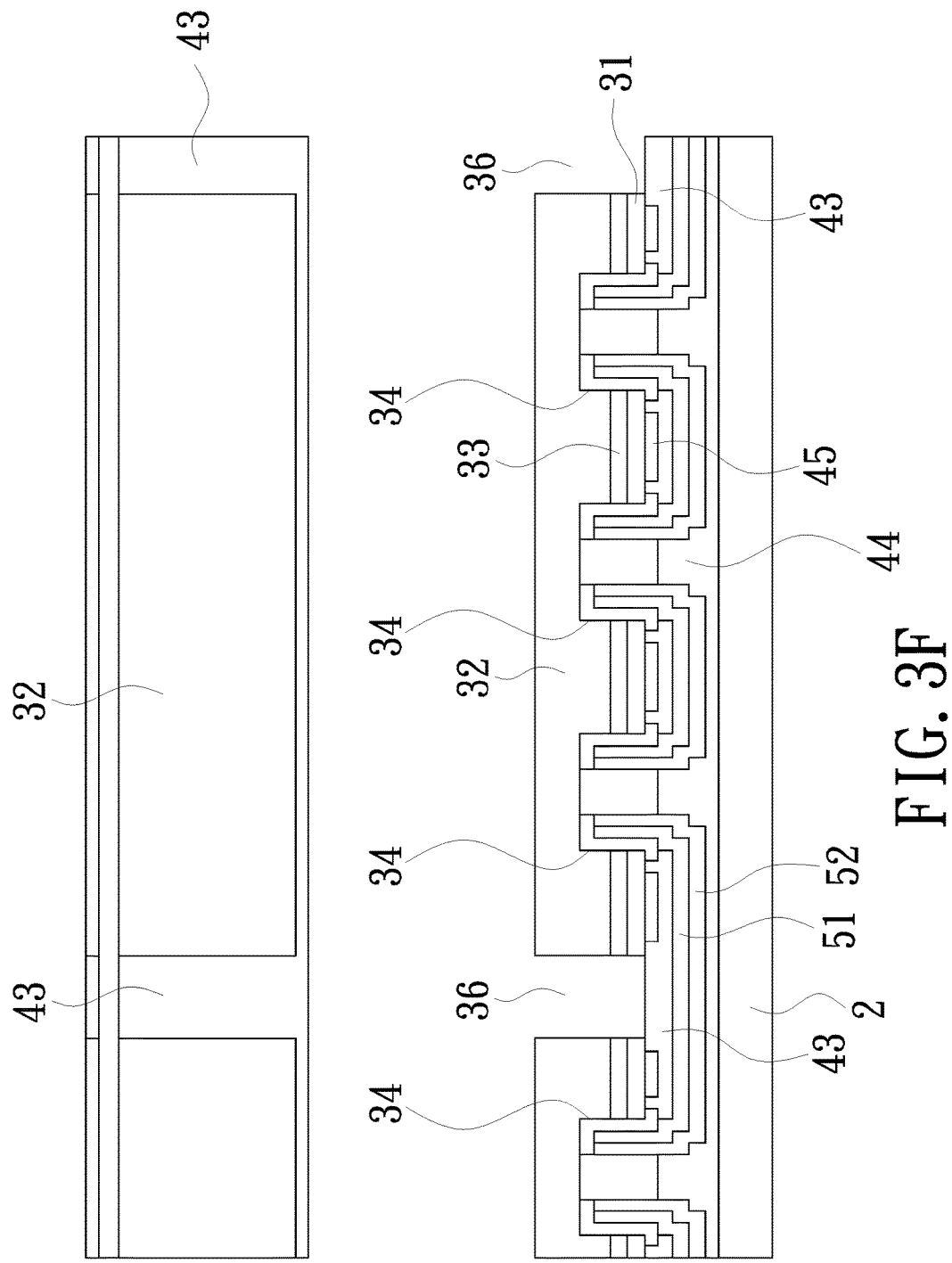
Figure 3G:
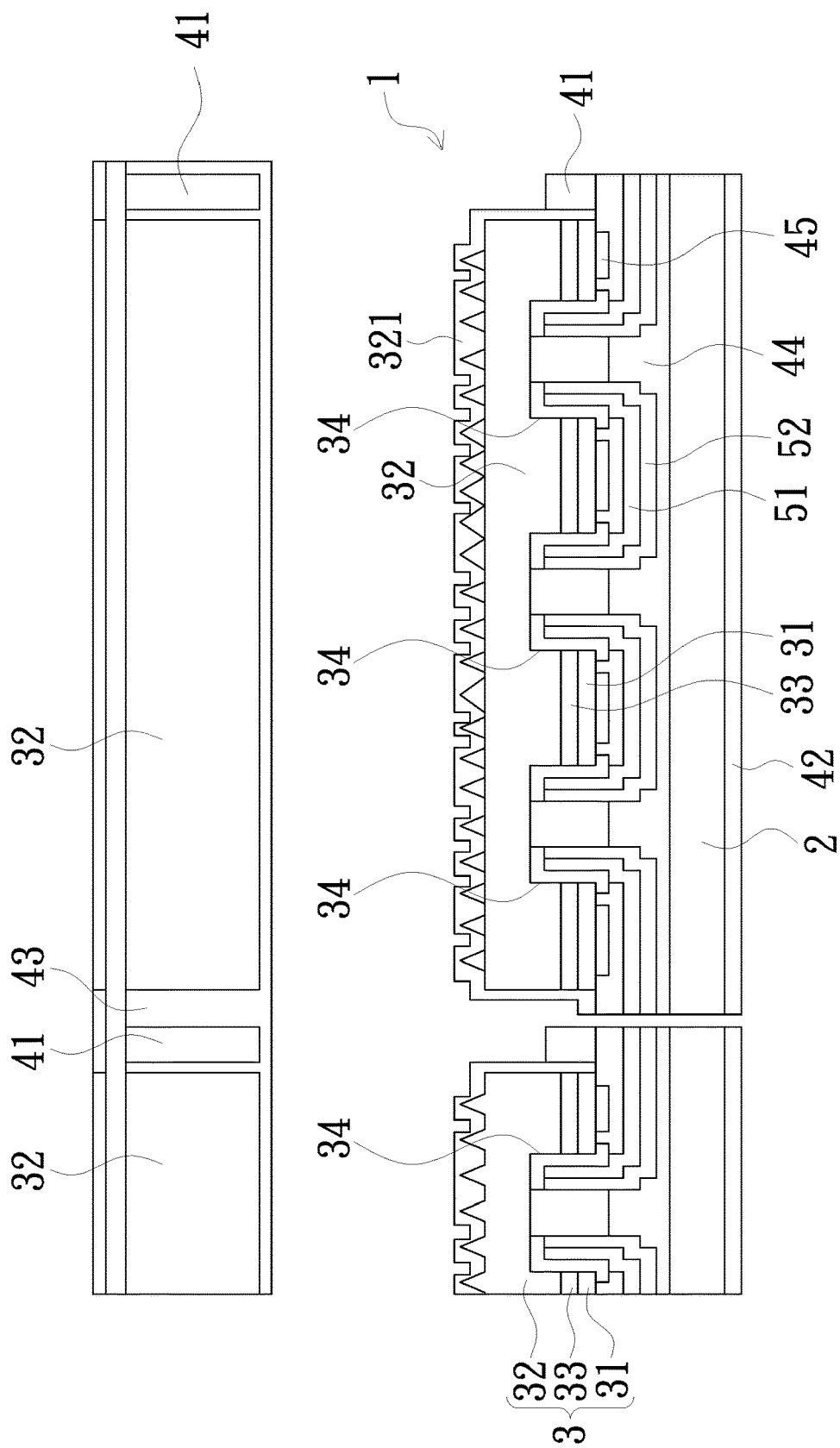

FIG. 3F illustrates the step of forming the trench 36 by removing the partial semiconductor main body 3 after peeling or grinding to remove the growth substrate 7 after the flip operation and plasma etching the buffer layer 8. In which, the surface of part of the first electrical connection layer 43 is exposed at the bottom of the trench 36. In FIG. 3G, the surface of the second semiconductor layer 32 is roughened, and metal such as Cr, Pt, or Au is sputtered in the trench 36 to form the first electrode 41, and the roughened surface of the second semiconductor layer 32 is covered by a transparent protective layer 321 made of SiO2. In addition, a metal such as Ti, Pt or Au is sputtered on the surface of the conductive carrier 2 to form a second electrode 42.

Figure 4A:
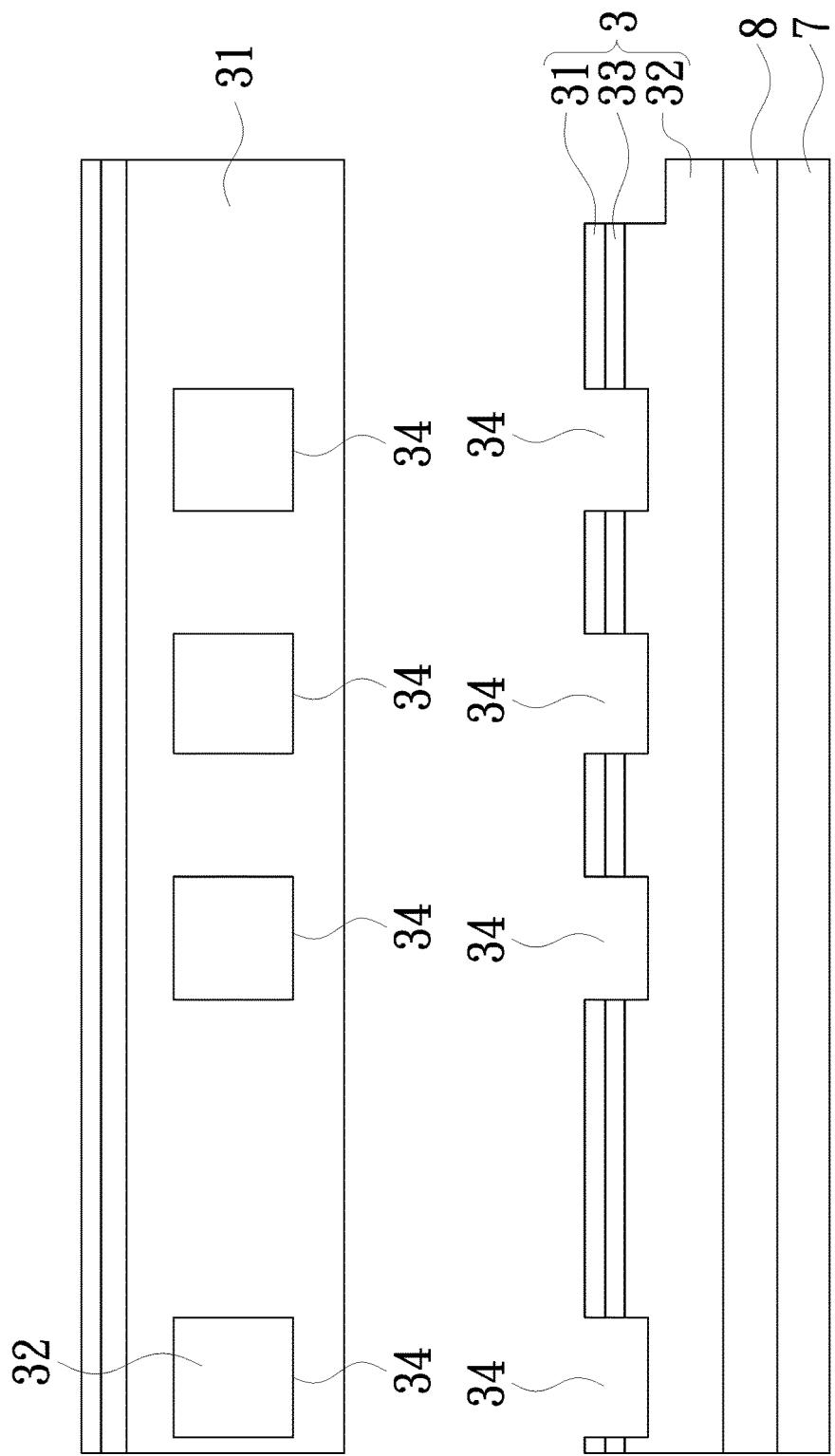
FIGS. 4A to 4G are schematic views of a manufacturing process of a photovoltaic semiconductor according to another embodiment of the invention.
Figure 4B:
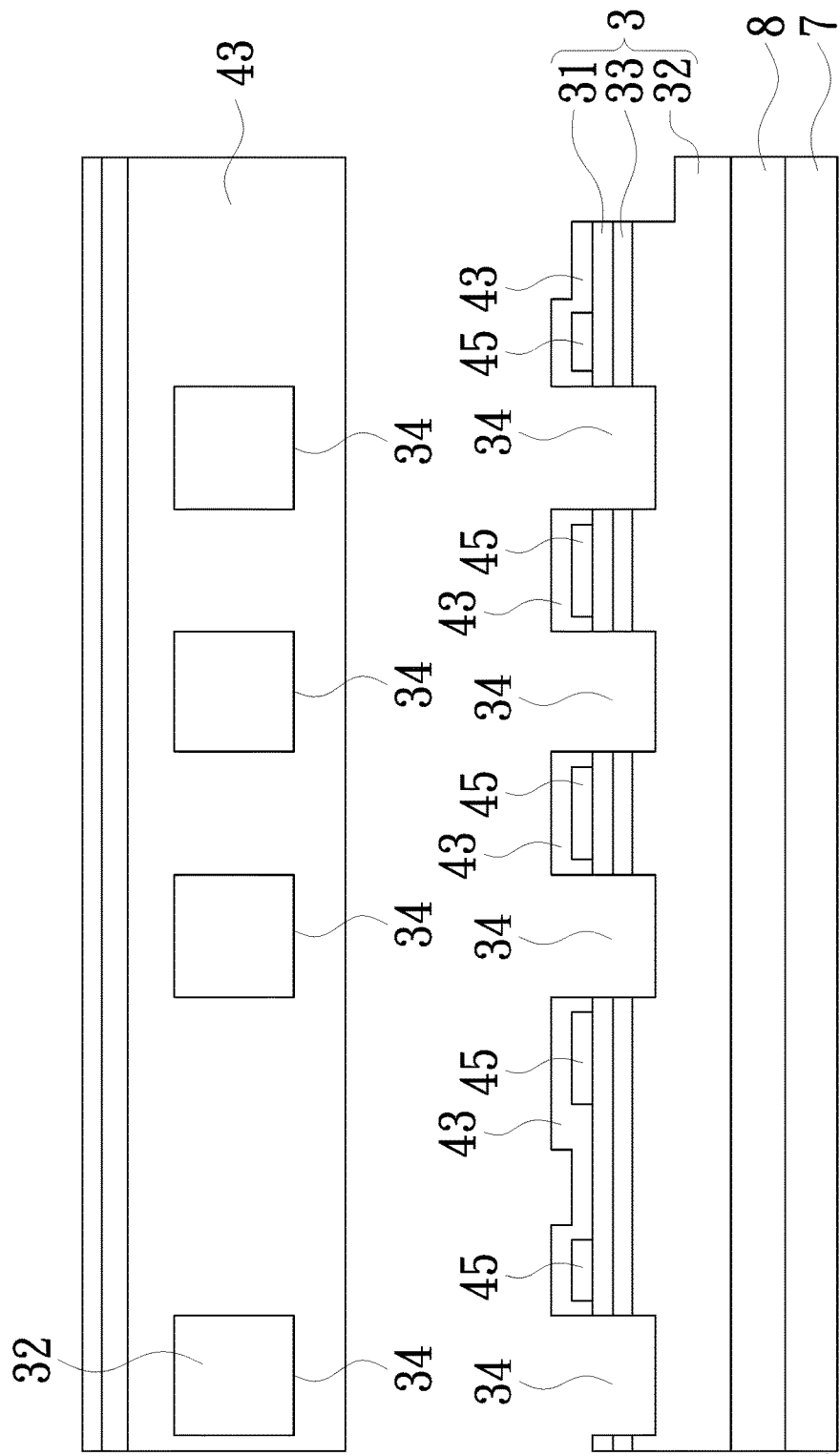
Figure 4C:
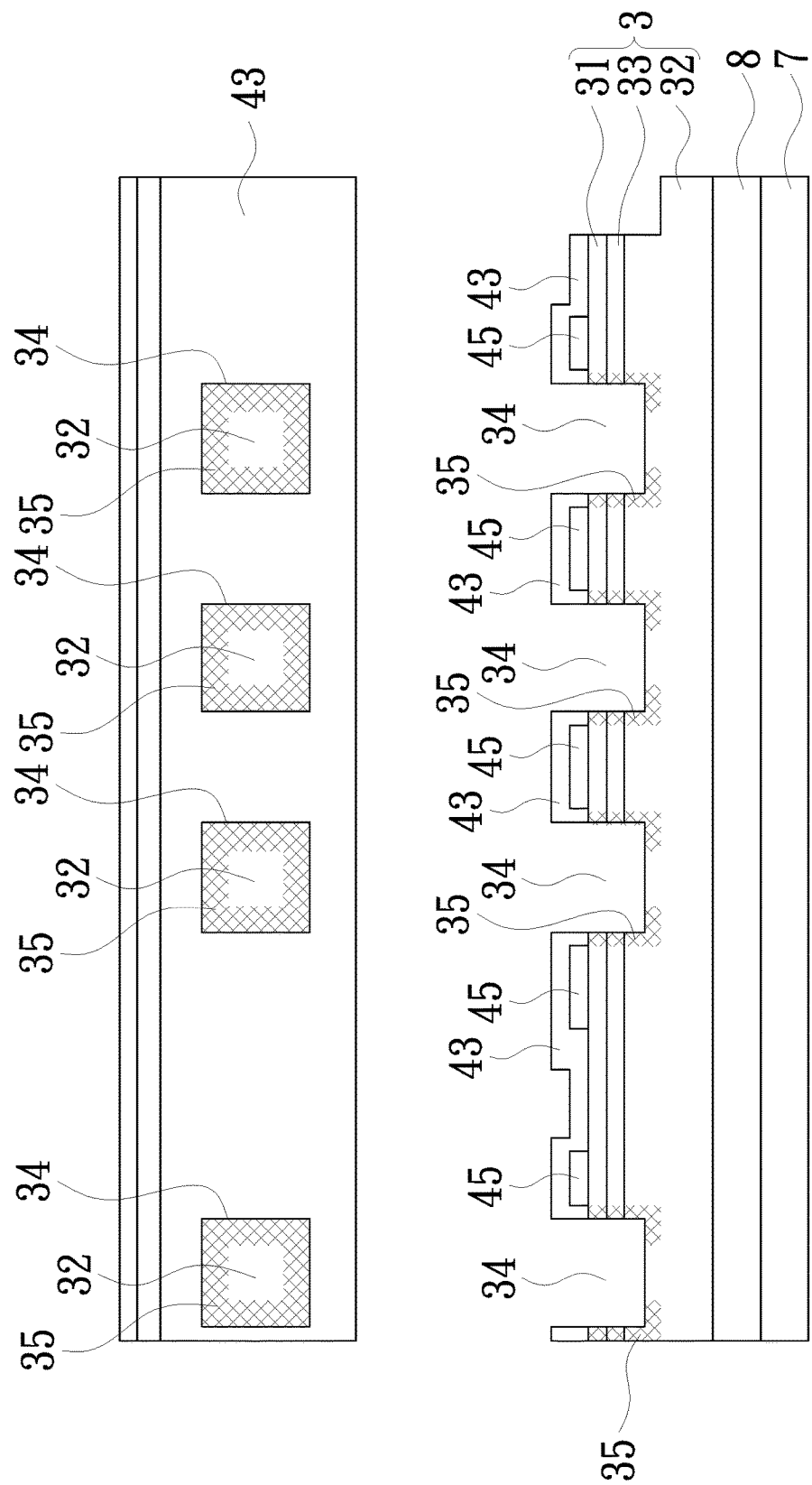
Figure 4D:
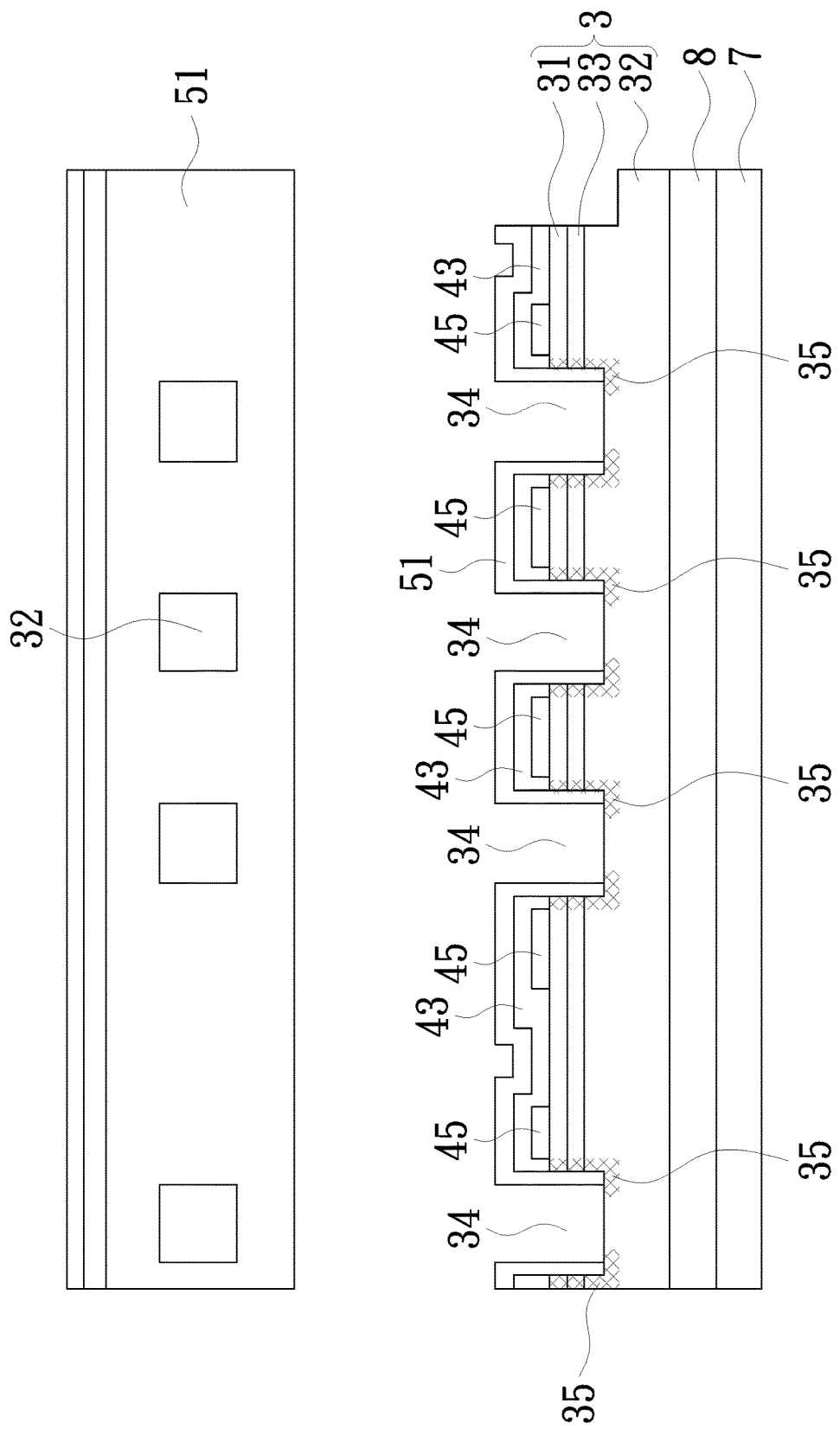
Figure 4E:
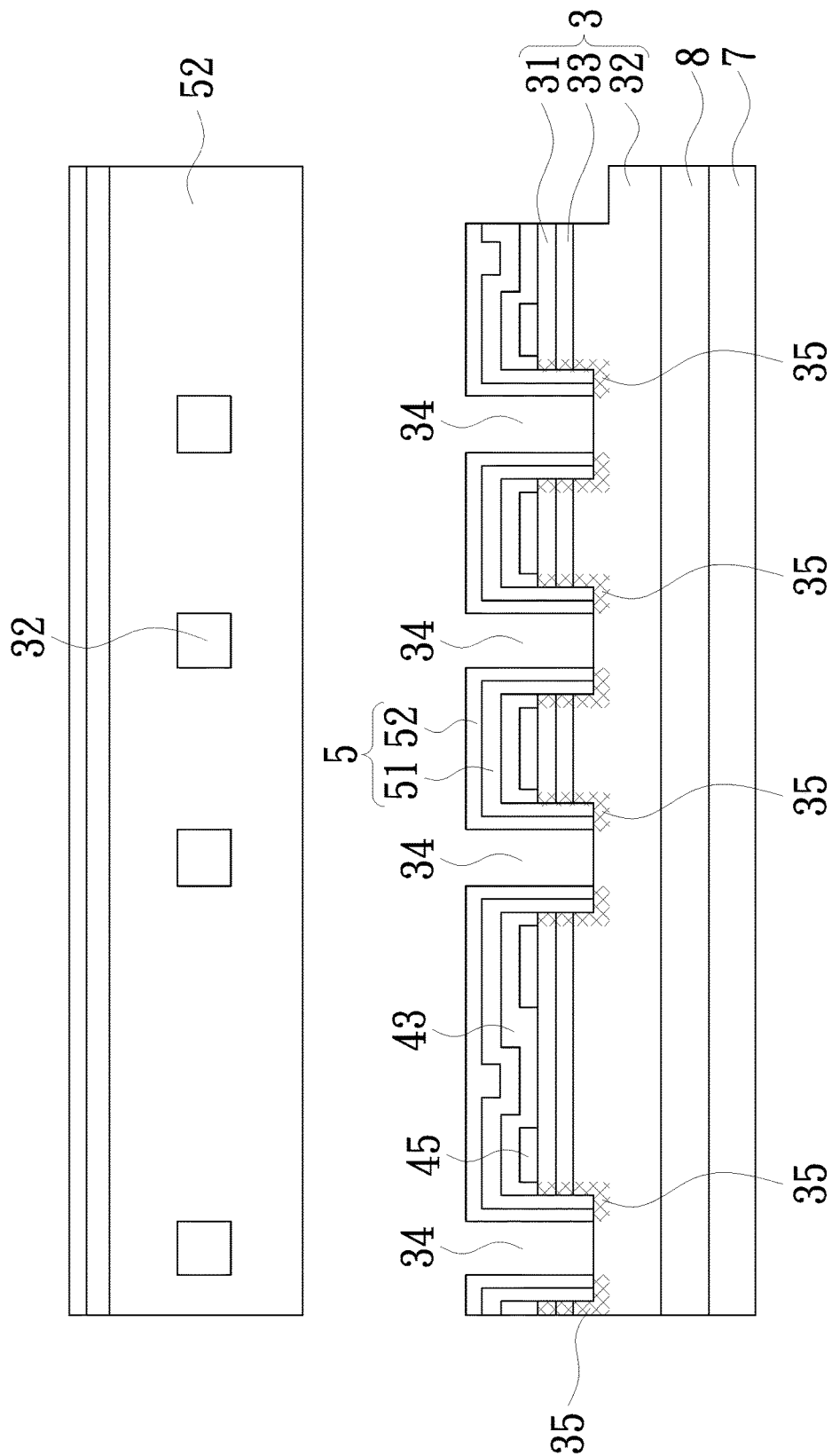
Figure 4F:
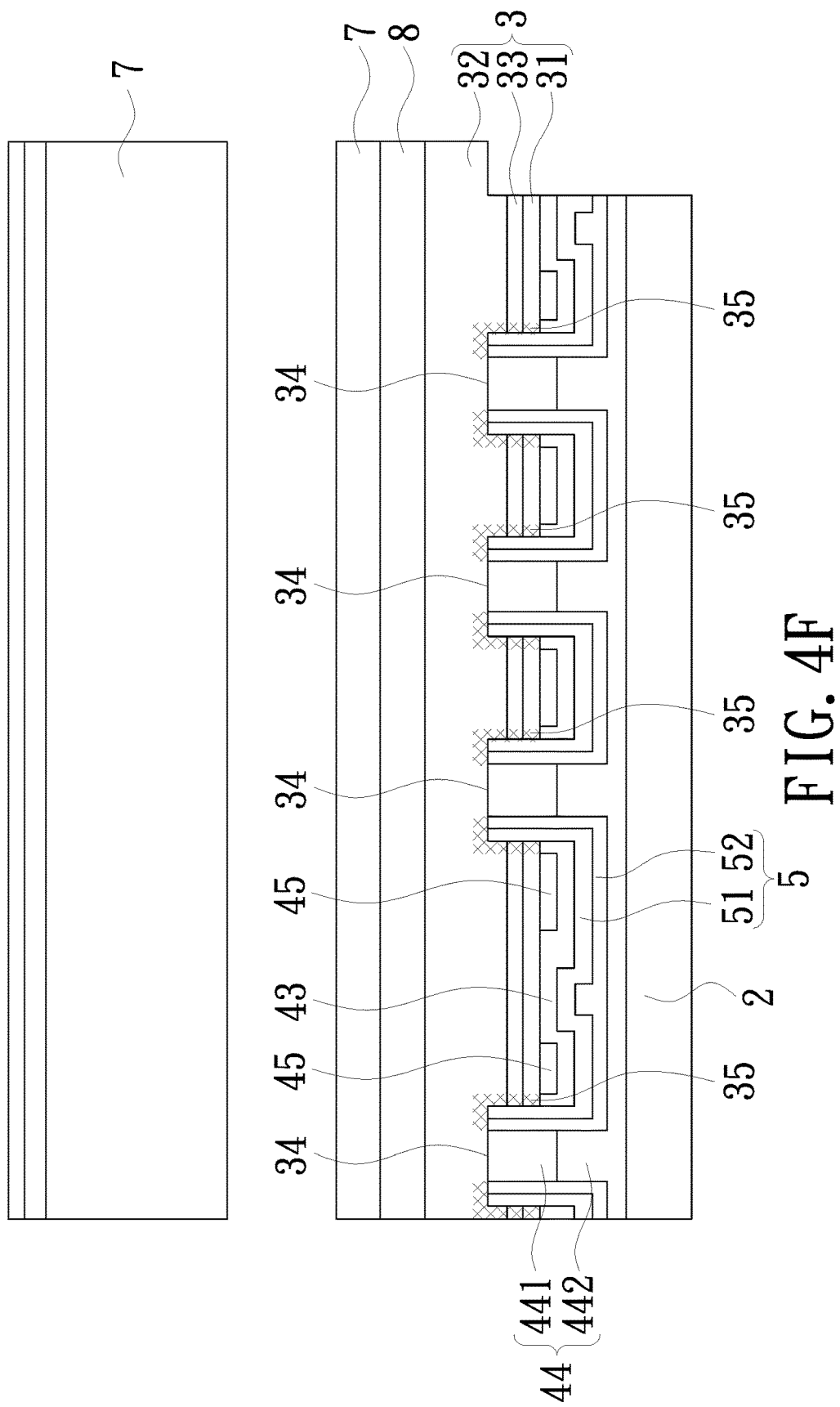
Figure 4G:
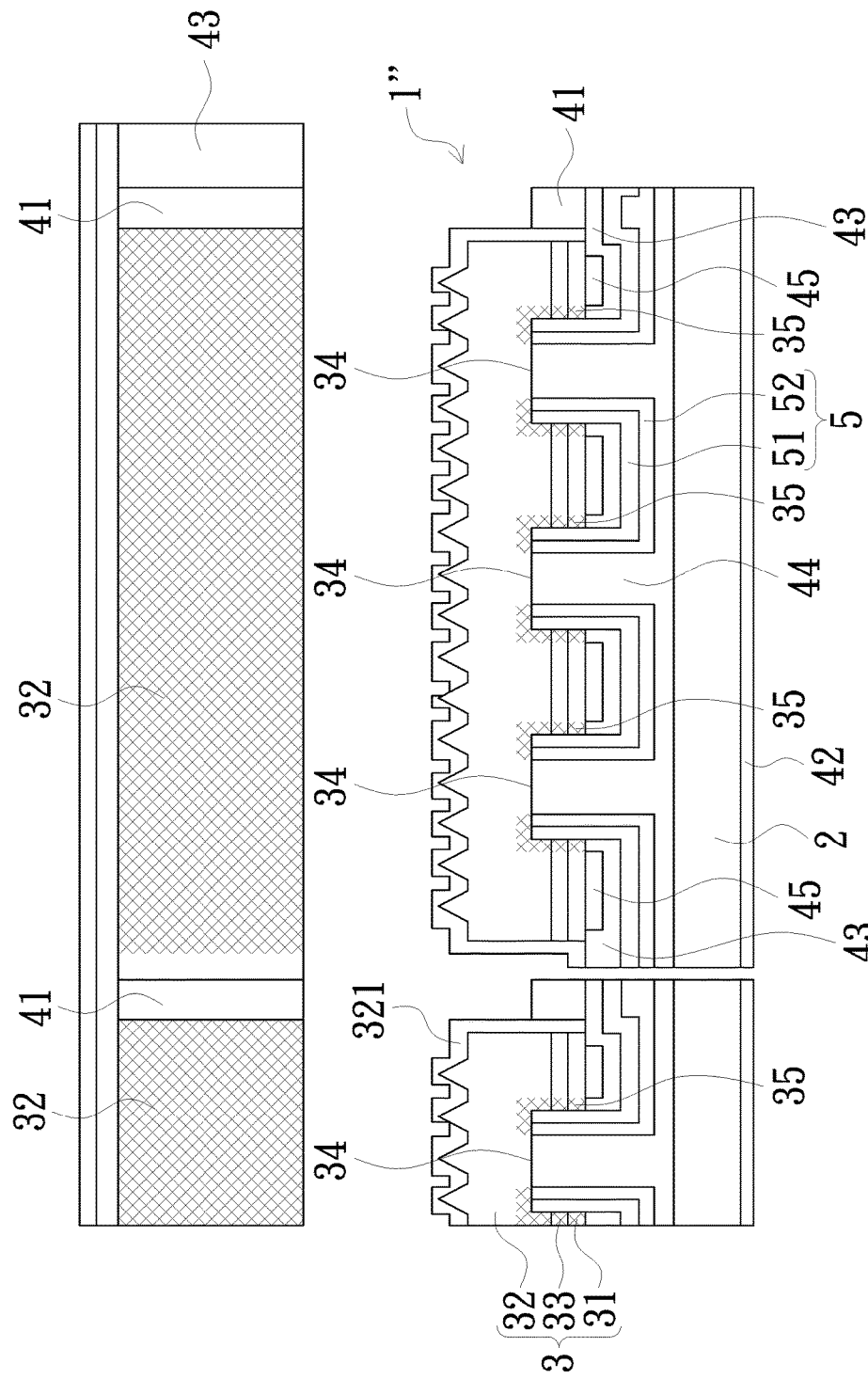

In the manufacturing process according to another embodiment shown in FIGS. 4A to 4G, most of the steps are similar to those shown in FIGS. 3A to 3G, but after forming the mirror ohmic contact layer 45 and the first electrical connection layer 43 shown in FIG. 4B, the insulation layer 6 as shown in FIG. 3B is not formed. Instead, as shown in FIG. 4C, the passivated surface 35 is formed on the side surface and the bottom peripheral surface of the concave part 34 by the plasma surface treatment. As a result, when the first electrical conductive semiconductor layer 51 as shown in FIG. 4D is formed, the passivated surface 35 electrically isolates the semiconductor main body 3 and the first electrical conductive layer 51.

To sum up, the invention provides a zener diode structure in a current path of a photovoltaic semiconductor and does not require a protective element such as an additional parallel diode outside the light emitting diode wafer, so that the cost and the space for saving the circuit layout of the electronic product. At the same time, zener diode structures may be connected by metal layer in series, which will increase the flexibility to adjust or change the scope of application of the device, and reduce the design and production costs. The foregoing is merely illustrative of the embodiments of the invention and is not intended to be limiting of the invention. While the invention has been disclosed by way of example, it is not intended to be limiting of the invention. It is to be understood that within the scope of the technical solutions of the invention, the equivalent embodiments of the invention may be modified and modified to be equivalent to those skilled in the art without departing from the scope of the technical solutions of the invention. Any simple modifications, equivalent variations and modifications of the embodiments are within the scope of the technical solutions of the invention.

What is claimed is:

1. An optoelectronic semiconductor device comprising:
   a conductive carrier;
   a semiconductor main body comprising a first semiconductor layer, a second semiconductor layer, and a radiation emitting layer for emitting electromagnetic radiation, wherein the radiation emitting layer is sandwiched between the first semiconductor layer and the second semiconductor layer, the second semiconductor layer is disposed on a side of the radiation emitting layer away from the conductive carrier, and the semiconductor main body comprising at least a concave part extending from a surface of the first semiconductor layer and penetrating through the radiation emitting layer;
   a first electrode and a second electrode;
   a first electrical connection layer, electrically connected between the first semiconductor layer and the first electrode;
   a second electrical connection layer, electrically connected between the second semiconductor layer and the second electrode, and the concave part being extruded from the conductive carrier toward the second semiconductor layer; and
   a zener diode structure disposed between the first electrical connection layer and the second electrical connection layer, so that the first electrical connection layer and the second electrical connection layer are electrically connected with each other, wherein at least a portion of the zener diode structure is disposed on a current path between the first electrode and the second electrode.

2. The optoelectronic semiconductor device according to claim 1, wherein the zener diode structure comprises:
   a first electrical conductive semiconductor layer disposed on a side of the zener diode structure facing the first electrical connection layer; and
   a second electrical conductive semiconductor layer disposed on a side of the zener diode structure facing the second electrical connection layer.

3. The optoelectronic semiconductor device according to claim 2, wherein the zener diode structure comprises a plurality of zener diode structures connected in series, and two adjacent ones of the zener diode structures are connected by a metal layer.

4. The optoelectronic semiconductor device according to claim 1, wherein the zener diode structure is disposed on the side of the second electrical connection layer away from the conductive carrier, and extending toward the second semiconductor layer with the second electrical connection layer in the concave part.

5. The optoelectronic semiconductor device according to claim 4, further comprising an insulation layer disposed within the concave part, and insulating the semiconductor main body and the zener diode structure.

6. The optoelectronic semiconductor device according to claim 4, wherein a contact surface of the semiconductor main body adjacent to the zener diode structure is a passivated surface.

7. The optoelectronic semiconductor device according to claim 1, wherein the first electrical connection layer is disposed on a side of the zener diode structure away from the conductive carrier, and is electrically connected with the first semiconductor layer on a side of the first electrical connection layer away from the conductive carrier.

8. The optoelectronic semiconductor device according to claim 7, wherein the first electrical connection layer is a mirror protective layer.

9. The optoelectronic semiconductor device according to claim 8, further comprising a mirror ohmic contact layer disposed between the mirror protective layer and the first semiconductor layer, and providing an ohmic contact between the mirror protective layer and the first semiconductor layer.

10. A manufacturing method of an optoelectronic semiconductor device, comprising:
   forming a semiconductor main body, wherein the semiconductor main body comprises a first semiconductor layer, a second semiconductor layer, and a radiation emitting layer sandwiched between the first semiconductor layer and the second semiconductor layer;
   etching a concave part on the semiconductor main body, wherein the concave part penetrating through the radiation emitting layer and extending toward the first semiconductor layer;
   forming a first electrical connection layer on the semiconductor main body, wherein the first electrical connection layer is electrically connected with the first semiconductor layer;
   forming at least a zener diode structure on the first electrical connection layer;
   forming a second electrical connection layer on the zener diode structure, wherein through the zener diode structure, the first electrical connection layer is electrically dependent on the second electrical connection layer; and
   forming a first electrode and a second electrode, electrically connected to the first electrical connection layer and the second electrical connection layer, respectively, and having at least a partial structure of the zener diode structure disposed within the current path between the first electrode and the second electrode.

11. The manufacturing method of the optoelectronic semiconductor device according to claim 10, wherein forming the zener diode structure comprises steps of:
   forming a first electrical conductive semiconductor layer on the first electrical connection layer;
   forming a second electrical conductive semiconductor layer on the first electrical conductive semiconductor layer, so as to construct a zener diode structure with the first electrical conductive semiconductor layer;
   when more than one of the zener diode structure are to be formed, executing a series connecting process, the series connecting process comprises forming a metal layer on the second electrical conductive semiconductor layer of a last formed zener diode structure to be series connected, and forming a zener diode structure next to the last formed zener diode structure; and
   repeatedly executing the series connecting process until the number of the zener diode structures achieve a predetermined value.

12. The manufacturing method of the optoelectronic semiconductor device according to claim 10, wherein forming the second electrical connection layer comprises steps of:
   forming an upper half portion of the second electrical connection layer within the concave part, wherein the upper half portion is electrically connected with the second semiconductor layer on the bottom side of the concave part; and
   forming a lower half portion of the second electrical connection layer on the zener diode structure, and the lower half portion is electrically connected with the upper half portion.

13. The manufacturing method of the optoelectronic semiconductor device according to claim 10, further comprising forming an insulation layer within the concave part for insulating the semiconductor main body and the zener diode structure.

14. The manufacturing method of the optoelectronic semiconductor device according to claim 10, further comprising forming a passivated surface on a contact surface of the semiconductor main body adjacent to the zener diode structure through a plasma surface treatment, so that the semiconductor main body is insulated with the zener diode structure.

15. The manufacturing method of the optoelectronic semiconductor device according to claim 10, wherein the first electrical connection layer is a mirror protective layer.

16. The manufacturing method of the optoelectronic semiconductor device according to claim 15, further comprising forming a mirror ohmic contact layer disposed between the mirror protective layer and the first semiconductor layer for providing an ohmic contact between the mirror protective layer and the first semiconductor layer.

17. The manufacturing method of the optoelectronic semiconductor device according to claim 10, further comprising:
   forming a conductive carrier on the second electrical connection layer after forming the second electrical connection layer.

18. The manufacturing method of the optoelectronic semiconductor device according to claim 17, wherein the semiconductor main body is formed on a growth substrate, and the manufacturing method further comprises:
   executing a flip operation after forming the conductive carrier, so that orientations of the conductive carrier and the growth substrate are exchanged; and
   removing the growth substrate.

19. The manufacturing method of the optoelectronic semiconductor device according to claim 18, further comprising:
   forming a buffer layer on the growth substrate before forming the semiconductor main body, and remove the buffer layer after executing the flip operation.

* * * * *